(12) United States Patent
Toshima et al.

(10) Patent No.: US 6,759,587 B2
(45) Date of Patent: Jul. 6, 2004

(54) THERMOELECTRIC MATERIALS, THERMOELECTRIC DEVICE, AND METHOD FOR PRODUCING THERMOELECTRIC MATERIALS

(75) Inventors: Naoki Toshima, 3-5-511, Nishidai 4-chome, Itabashi-ku (JP), 175-0045; Hu Yan, Onoda (JP); Kohsuke Kamei, Niihama (JP); Akinori Tsubata, Yokohama (JP); Takashi Tokuda, Yokohama (JP)

(73) Assignees: Hokushin Corporation, Kanagawa (JP); Naoki Toshima, Tokyo (JP)

( * ) Notice: Subject to any disclaimer, the term of this patent is extended or adjusted under 35 U.S.C. 154(b) by 231 days.

(21) Appl. No.: 10/134,221

(22) Filed: Apr. 26, 2002

(65) Prior Publication Data

US 2003/0032709 A1 Feb. 13, 2003

(30) Foreign Application Priority Data

Apr. 27, 2001 (JP) ........................................ 2001-130837

(51) Int. Cl.$^7$ ............................................... H01L 35/12
(52) U.S. Cl. ..................... 136/236.1; 136/238; 136/239; 136/240; 252/519.13; 252/519.14; 252/519.33; 252/519.4; 252/521.4
(58) Field of Search ............................. 136/236.1, 238, 136/239, 249; 252/519.13, 519.14, 519.33, 519.4, 521.4

(56) References Cited

U.S. PATENT DOCUMENTS 5,973,050 A 10/1999 Johnson et al. ............. 524/439

FOREIGN PATENT DOCUMENTS

JP 08032124 2/1996

OTHER PUBLICATIONS

Soviet Physics Solid State Physics. L.D. Dudkin and N.Kh.Abriko Sov., *On the Doping of the Semiconductor Compound Co Sb$_3$*, pp. 126–133. 1959.
Soviet Physics Solid State Physics. B.N. Zobrina and L.D. Dudkin, *Investigation of the Thermoelectric Properties of Co Sb$_3$ with Sn, Te, and Ni Impurities*, pp. 1668–1674. 1960.
American Institute of Physics. K. Matsubara, T. Iyanaga, T. Tsubouchi, K. Kishimoto and T. Koyanagi., *Thermoelectric Properties of (Pd,Co)Sb$_3$ Compounds with Skutterudite Structure*, pp. 226–229. 1995.
Cape Cod Research. Department of the Army, Edgar Larzaro, Murty Bhamidipati, Matt Aldissi, and Brian Dixon., *Thermoelectric Organic.*, Jun., 1998.

*Primary Examiner*—Patrick Ryan
*Assistant Examiner*—Thomas H. Parsons
(74) *Attorney, Agent, or Firm*—Huntley & Associates, LLC.

(57) ABSTRACT

The present invention provides the novel thermoelectric materials having, in combination, processability and excellent thermoelectric characteristics, the thermoelectric materials being able to provide n-type thermoelectric characteristics in accordance with the nature of the employed inorganic thermoelectric materials; a thermoelectric device employing the materials; and a method for producing the thermoelectric materials. The thermoelectric materials contain an organic thermoelectric component and an inorganic thermoelectric component, wherein the organic thermoelectric component and the inorganic thermoelectric component are united in a dispersed state, the organic thermoelectric component being at least one species selected from among polyaniline and derivatives thereof; polypyrrole and derivatives thereof; polythiophene and derivatives thereof; polyphenylenevinylene derivatives; poly(p-phenylene) derivatives; polyacene derivatives; and copolymers thereof, and the inorganic thermoelectric component being at least one species selected from among Bi—(Te, Se) series, Si—Ge series, Pb—Te series, GeTe—AgSbTe series, (Co, Ir, Ru)—Sb series, and (Ca, Sr, Bi)Co$_2$O$_5$ series.

24 Claims, 2 Drawing Sheets

- ■ Example 4
- ● Example 5
- ◇ Comparative Example 1
- □ Comparative Example 2
- ○ Comparative Example 3
- △ Comparative Example 4
- —— Comparative Example 5
- ---- Comparative Example 6

● Example 2 TPF
■ Example 3 TPF
□ Example 3 ZT

■ Example 4
● Example 5
◇ Comparative Example 1
□ Comparative Example 2
○ Comparative Example 3
△ Comparative Example 4
── Comparative Example 5
---- Comparative Example 6

THERMOELECTRIC MATERIALS, THERMOELECTRIC DEVICE, AND METHOD FOR PRODUCING THERMOELECTRIC MATERIALS

BACKGROUND OF THE INVENTION

1. Field of the Invention

The present invention relates to thermoelectric materials to be employed for so-called thermoelectric conversion (i.e., direct energy conversion without use of any moving parts), including power generation on the basis of the Seebeck effect and electronic cooling on the basis of the Peltier effect. More particularly, the invention relates to thermoelectric materials comprising hybrid of organic polymer and inorganic thermoelectric materials for attaining, in combination, good moldability provided by the organic polymer and good thermoelectric characteristics provided by the inorganic thermoelectric materials. The invention also relates to a thermoelectric conversion device containing the materials and to a method for producing the materials.

2. Background Art

Thermoelectric conversion by use of a thermoelectric conversion materials; e.g., thermoelectric power generation or electronic cooling, finds utility in a simplified direct-energy-conversion apparatus having no mobile parts that generate vibration, noise, wear, etc.; having a simple, reliable structure; having a long service life; and facilitating maintenance. Thus, thermoelectric conversion is suitable for direct generation of DC power without combustion of a variety of fossil fuels or other sources and for temperature control without use of a cooling medium.

Characteristics of thermoelectric conversion materials are evaluated on the basis of thermoelectric power factor (TPF) and thermoelectric figure of merit (ZT), which are represented by the following formulas:

$$TPF = S^2 \sigma \quad \text{[Formula 1]}$$

$$ZT = \frac{S^2 \sigma}{\kappa'} \times T \quad \text{[Formula 2]}$$

wherein S represents the Seebeck coefficient; σ represents electric conductivity; and κ represents thermal conductivity. Thermoelectric conversion materials desirably have a high ZT; i.e., a high Seebeck coefficient (S), high electric conductivity (σ), and low thermal conductivity (κ).

For example, when employed for thermoelectric conversion such as thermoelectric power generation, thermoelectric conversion materials desirably have a thermoelectric figure of merit as high as ZT=0.02 or higher and to operate without variation for a long period of time under varying operation conditions. Mass production of thermoelectric power generators for use in vehicles or employing discharged heat gives rise to demand for thermoelectric conversion materials which have sufficiently high heat resistance and strength, particularly at high temperature, and resistance to deterioration in characteristics, as well as a method for producing the materials with high efficiency and at low cost.

Conventionally, PbTe or silicide materials including silicide compounds such as $MSi_2$ (M: Cr, Mn, Fe, or Co) and mixtures thereof have been used to serve as the aforementioned thermoelectric conversion materials.

Sb compounds such as $TSb_3$ (T: Co, Ir, or Ru) have also been used. For example, there has been disclosed thermoelectric materials which comprise materials containing $CoSb_3$ as a predominant component and an impurity added for determination of conduction type (L. D. Dudkin and N. Kh. Abriko Sov, Soviet Physics Solid State Physics (1959) p. 126; B. N. Zobrinaand, L. D. Dudkin, Soviet Physics Solid State Physics (1960) p. 1668; and K. Matsubara, T. Iyanaga, T. Tsubouchi, K. Kishimoto, and T. Koyanagi, American Institute of Physics (1995) p. 226–229).

A variety of inorganic thermoelectric materials, including Bi—(Te, Se) series (e.g., bismuth telluride); Si—Ge series; Pb—Te series; GeTe—AgSbTe series; and (Ca, Sr, Bi)$Co_2O_5$ series, have been proposed and studied.

Some of the aforementioned inorganic thermoelectric materials have been proven to have excellent thermoelectric characteristics acceptable for practical use. However, these materials involve a drawback, in that they are difficult to process.

Japanese Patent Application Laid-Open (kokai) No. 8-32124 discloses a method for producing a thermoelectric conversion device including producing an ingot and cutting the ingot to thereby form a thermoelectric conversion device in the form of a rectangular prism. However, such an ingot is difficult to process, and material loss is significant. In addition, breaking and chipping during cutting is thought to lower the yield of the thermoelectric materials.

With regard to organic thermoelectric materials having good processability, polyaniline has been studied.

Another thermoelectric materials comprising polyaniline serving as organic thermoelectric materials and vanadium oxide has been proposed (E. Lazaro, M. Bhamidipati, M. Aldissi, and B. Dixon, AD Rep, p. 1–35 (1998)). Still another thermoelectric materials comprising polyaniline serving as organic thermoelectric materials and NaFeP (whiskers or nano-wires) has been proposed (J. Wang et al., 20th International Conference on Thermoelectrics, p. 352–355 (2001)).

However, these organic thermoelectric materials also involve a drawback, in that they have poor thermoelectric characteristics as compared with inorganic thermoelectric materials.

U.S. Pat. No. 5,973,050 discloses another thermoelectric materials based on organic thermoelectric materials in which metal (e.g., silver, gold, or platinum) in powder form is dispersed.

However, the organic thermoelectric materials disclosed in U.S. Pat. No. 5,973,050 has a Seebeck coefficient of p-type.

In general, thermoelectric materials employing organic thermoelectric materials exhibit p-type characteristics. When production of a thermoelectric device such as a Peltier device is contemplated, an n-type thermoelectric materials formed of the same materials as the counter p-type materials are required. Thus, provision of thermoelectric materials exhibiting the n-type thermoelectric characteristic is important.

SUMMARY OF THE INVENTION

The present inventors have conducted extensive studies in order to overcome the aforementioned drawbacks, and have found that hybridization of organic thermoelectric materials and inorganic thermoelectric materials through a specified method enables production of novel thermoelectric materials which exhibit the excellent processability of organic thermoelectric materials and the excellent thermoelectric characteristics of inorganic thermoelectric materials, and which may exhibit n-type thermoelectric characteristics. The present invention has been accomplished on the basis of this finding.

Thus, an object of the present invention is to provide thermoelectric materials having processability and excellent thermoelectric characteristics in combination and which can provide n-type thermoelectric characteristics in accordance with the nature of the employed inorganic thermoelectric materials. Another object of the invention is to provide a thermoelectric device employing the materials. Still another object of the invention is to provide a method for producing thermoelectric materials.

Accordingly, in a first aspect of the present invention, there are provided thermoelectric materials comprising an organic thermoelectric component and an inorganic thermoelectric component, wherein the organic thermoelectric component and the inorganic thermoelectric component are united in a dispersed state, the organic thermoelectric component being at least one species selected from among polyaniline and derivatives thereof; polypyrrole and derivatives thereof; polythiophene and derivatives thereof; polyphenylenevinylene derivatives; poly(p-phenylene) derivatives; polyacene derivatives; and copolymers thereof, and the inorganic thermoelectric component being at least one species selected from among Bi—(Te, Se) series, Si—Ge series, Pb—Te series, GeTe—AgSbTe series, (Co, Ir, RU)—Sb series, and (Ca, Sr, Bi)Co$_2$O$_5$ series.

The inorganic thermoelectric component may have a particle size of several hundreds $\mu$m or less, whereby the thermoelectric materials are formed by dissolving the organic thermoelectric component in an organic solvent to thereby yield a solution; dispersing the inorganic thermoelectric component in the solution to thereby yield a dispersion liquid; and removing the organic solvent from the dispersion liquid.

The thermoelectric materials may be in the form of thin film.

The thermoelectric materials may form at least one layer in multilayer film comprising a plurality of stacked thin films.

The inorganic thermoelectric component in the form of microparticles may be surrounded by the organic thermoelectric component in the dispersed state.

In the thermoelectric materials the ratio by mol of the organic thermoelectric component to the inorganic thermoelectric component may be at least 1/99.

In the thermoelectric materials the ratio by mol of the organic thermoelectric component to the inorganic thermoelectric component may be 1/99 to 91/9.

The organic and inorganic thermoelectric components may be united through heat treatment.

The heat treatment may be performed at 50° C. to 500° C.

The thermoelectric materials may have a thermoelectric figure of merit (ZT) of at least 0.02.

The inorganic thermoelectric component may further contain a plasticizer, and may be united such that microparticles thereof cohere together.

The thermoelectric materials may contain the inorganic thermoelectric component in an amount of 10–70 mol based on 1 mol of the organic thermoelectric component.

The plasticizer may be an ionic liquid.

The thermoelectric materials may contain the plasticizer in an amount of 0.01–0.2 mol based on 1 mol of the organic thermoelectric component.

The inorganic thermoelectric component may have a particle size of 50 $\mu$m or less.

The inorganic thermoelectric component may be treated with a titanate series or silane series surface treating agent.

In a second aspect of the present invention, there is provided a thermoelectric device employing the aforementioned thermoelectric materials.

In a third aspect of the present invention, there is provided a method for producing thermoelectric materials comprising:

dispersing an inorganic thermoelectric component in an organic thermoelectric component solution in which at least a portion of an organic thermoelectric component is dissolved, to thereby yield a dispersion; and applying the dispersion to an object, to thereby form thereon thin film having one or more layers;

the organic thermoelectric component being at least one species selected from among polyaniline and derivatives thereof; polypyrrole and derivatives thereof; polythiophene and derivatives thereof; polyphenylenevinylene derivatives; poly(p-phenylene) derivatives; polyacene derivatives; and copolymers thereof, and the inorganic thermoelectric component being at least one species selected from among Bi—(Te, Se) series, Si—Ge series, Pb—Te series, GeTe—AgSbTe series, (Co, Ir, Ru)—Sb series, and (Ca, Sr, Bi)Co$_2$O$_5$ series.

The inorganic thermoelectric component may have a particle size of 50 $\mu$m or less.

The thermoelectric materials may contain the inorganic thermoelectric component in an amount of 10–70 mol based on 1 mol of the organic thermoelectric component.

The thermoelectric materials may further contain a plasticizer.

The plasticizer may be an ionic liquid.

The thermoelectric materials may contain the plasticizer in an amount of 0.01–0.2 mol based on 1 mol of the organic thermoelectric component.

The dispersion may be applied through a method selected from among casting, spin-coating, and dipping.

According to the present invention, hybridization is attained in a dispersion state where microparticles of an inorganic thermoelectric component are surrounded by an organic thermoelectric component. Thus, microparticles of the inorganic thermoelectric component are united by the mediation of an organic polymer serving virtually as a binder, to thereby establish an electric conductivity. The thus-yielded thermoelectric materials have processability almost comparable to that of organic polymeric materials and the excellent thermoelectric characteristics of inorganic thermoelectric materials. Therefore, thermoelectric materials exhibiting n-type thermoelectric characteristics and having such processability can also be produced.

BRIEF DESCRIPTION OF THE DRAWINGS

Various other objects and features and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
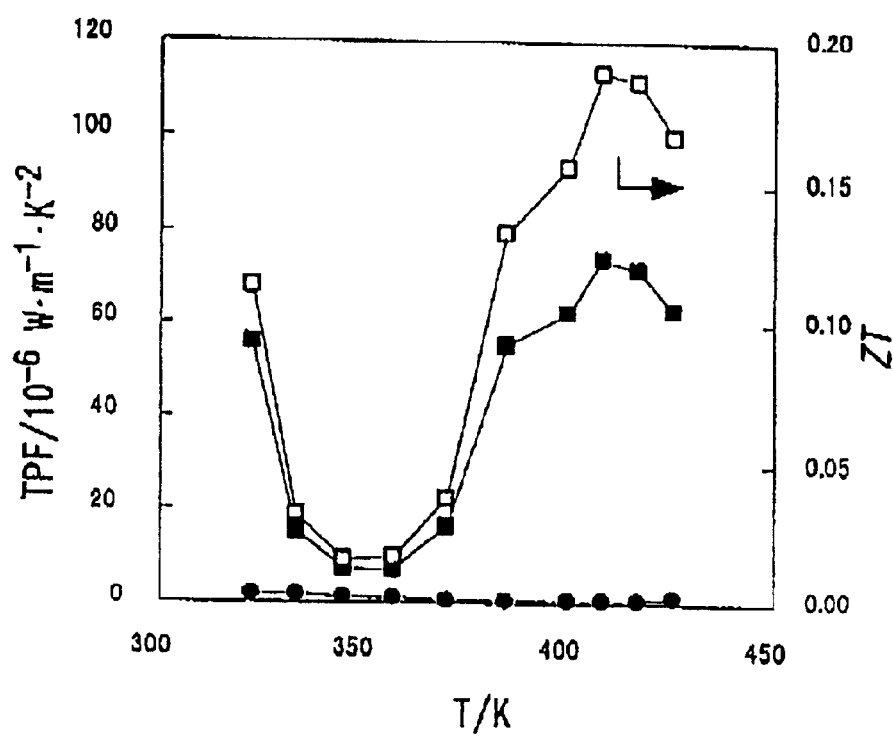
FIG. 1 is a graph showing thermoelectric power factor (TPF) and thermoelectric figure of merit (ZT) of samples of Examples 2 and 3.

The organic thermoelectric component of the present invention is a conductive organic polymer and attains unification of the conductive polymer and microparticles of inorganic materials while electric conduction is established among the microparticles. The thus-united hybrid materials can be produced by mixing microparticles of an organic thermoelectric component and those of an inorganic thermoelectric component and press-molding the resultant mixture under optional heat application. Alternatively, the thermoelectric materials can be produced by dissolving an organic thermoelectric component in an organic solvent; uniformly dispersing microparticles of an inorganic thermoelectric component in the resultant organic solution; applying the dispersion liquid; and removing the solvent. Of these, the latter method is preferred. Thus, the organic thermoelectric component is preferably soluble in an organic solvent. Instead of the above organic thermoelectric component, organic polymers having no electric conductivity can also be employed, so long as the polymers can be dissolved in an organic solvent. When such a non-conductive organic polymer is employed, the inter-particle distance in the inorganic thermoelectric component must be, at least at some portion, as small as several nm or less.

Examples of the organic thermoelectric component include polyaniline and derivatives thereof; polypyrrole and derivatives thereof; polythiophene and derivatives thereof; polyphenylenevinylene derivatives; poly(p-phenylene) derivatives; polyacene derivatives; and copolymers thereof. Of these, polyaniline and polypyrrole are preferred, from the standpoint of excellent thermoelectric characteristics and solubility in a solvent. Since polythiophene, polyphenylenevinylene, poly(p-phenylene), and polyacene are hardly soluble in a solvent, a moiety such as an alkyl group, a carboxylic acid group, a sulfonic acid group, or an ester moiety thereof is introduced into these polymers so as to form derivatives thereof which are preferably employed. In accordance with needs, these organic thermoelectric components may be doped with a dopant such as phosphoric acid, naphthalene sulfonic acid, toluenesulfonic acid, or camphorsulfonic acid.

No particular limitation is imposed on the organic solvent for dissolving the organic thermoelectric component, and any solvent can be used so long as the solvent can dissolve organic polymers. When polyaniline or polypyrrole is employed, solvents such as N-methylpyrrolidone (NMP), dimethyl sulfoxide (DMSO), dimethylformamide (DMF), m-cresol, toluene, and xylene can be used. When derivatives of polyaniline, polypyrrole, polythiophene, polyphenylenevinylene, poly(p-phenylene), and polyacene are employed, solvents such as chlorobenzene, chloroform, and tetrahydrofuran (THF) can be used.

In a dispersion in which microparticles of an inorganic thermoelectric component are dispersed in a solution prepared by dissolving such an organic thermoelectric component in an organic solution, a stabilized state of dispersion is obtained presumably because the inorganic thermoelectric component microparticles are surrounded by the relevant organic polymer. In order to attain such a stabilized dispersion state, the organic polymer is preferably selected from the viewpoint of effect of surrounding the microparticles, and the inorganic thermoelectric component is preferably selected in consideration of compatibility with the organic polymer solution, specific gravity, etc.

When the selected inorganic thermoelectric component has high compatibility, a particle size of the component of approximately several hundreds $\mu$m is acceptable, whereas when the compatibility is insufficient, the particle size is preferably controlled to 100 $\mu$m to several nm.

In order to promote dispersion of inorganic thermoelectric component microparticles, additives such as a surfactant may be added to form a dispersion.

By use of such a dispersion, thin-film hybrid thermoelectric materials are readily produced. In other words, a dispersion prepared by dispersing an inorganic thermoelectric component in an organic polymer solution is applied, to thereby readily produce thin-film thermoelectric materials.

No particular limitation is imposed on the inorganic thermoelectric component which can be used in the present invention, and any conventionally known inorganic thermoelectric materials and any inorganic thermoelectric materials which will be discovered in the future can be employed. Examples include Bi—(Te, Se) series, Si—Ge series, Pb—Te series, GeTe—AgSbTe series, (Co, Ir, Ru)—Sb series, and (Ca, Sr, Bi)$Co_2O_5$ series.

In order to provide a noticeable improvement by the characteristics of the organic thermoelectric component, the ratio by mol of the organic thermoelectric component to the inorganic thermoelectric component is controlled to, for example, at least 1/99. This is because the hybrid thermoelectric materials cannot be expected to exhibit the effect of the organic polymer when the organic thermoelectric component is contained at a ratio by mol of less than 1/99. Thus, the ratio by mol of the organic thermoelectric component to the inorganic thermoelectric component may be controlled to 1/99 to 91/9. By controlling the ratio within the aforementioned range, electric conduction among microparticles of the inorganic thermoelectric component can be established, and processability of the thermoelectric materials is advantageously enhanced through incorporation of the organic thermoelectric component.

In the meantime, when improvement in the processability of the inorganic thermoelectric component alone is desired, with improvement in the characteristics of the organic thermoelectric components being set aside, the inorganic thermoelectric component is preferably used in an amount of 10–70 mol based on 1 mol of the organic thermoelectric component. When a dispersion containing these components in the above-mentioned amounts is applied, thin-film thermoelectric conversion materials can be produced without difficulty.

In this case, a plasticizer is preferably used in order to enhance solubility of the organic thermoelectric component. No particular limitation is imposed on the type of plasticizer; however, an ionic liquid is preferably used, since the liquid can also impart electric conductivity.

As used herein, the term "ionic liquid" refers to a molten salt which assumes liquid at room temperature, and also encompasses a so-called "ambient-temperature molten salt" having a melting point of 70° C. or lower, preferably 30° C. or lower. The ionic liquid has characteristics such as very low vapor pressure (non-volatality), high heat resistance, low inflammability, and chemical stability.

The ionic liquid comprises a cation moiety and an anion moiety. Examples of cations include organic cations such as imidazolium ion including cyclic amidine ions or the like; pyridinium ion, ammonium ion, sulfonium ion, and phosphonium ion. Examples of anions include $AlCl_4^-$, $Al_2Cl_7^-$, $NO_3^-$, $BF_4^-$, $PF_6^-$, $CH_3COO^-$, $CF_3COO^-$, $CF_3SO_3^-$, $(CF_3SO_2)_2N^-$, and $(CF_3SO_2)_3C^-$. More specific examples of ionic liquid include combinations of an organic cation and a counter ion shown below:

(Cation List)

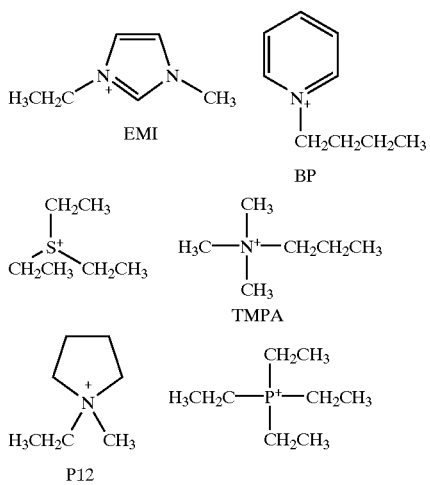

| (anion list) | |
|---|---|
| BF$_4^+$ | CH$_3$COO$^-$ |
| NO$_3^-$ | CF$_3$COO$^-$ |
| PF$_6^-$ | CF$_3$SO$_3^-$:TI |
| AlCl$_4^+$ | (CF$_3$SO$_2$)$_2$N$^-$:TFSI |
| Al$_2$Cl$_7^-$ | (CF$_3$SO$_2$)$_3$C$^+$:TFSM |

No particular limitation is imposed on the ionic liquid which can be used in the present invention, so long as the ionic liquid has compatibility with the organic thermoelectric component. No particular limitation is imposed on the amount of the ionic liquid employed in the present invention, and the ionic liquid can be used in an amount of approximately 0.01–0.2 mol based on 1 mol of the organic thermoelectric component.

As described above, the present invention employs a dispersion prepared by dispersing microparticles of an inorganic thermoelectric component in an organic thermoelectric component solution. Thus, thin-film thermoelectric materials whose formation has not been attained by conventional inorganic thermoelectric materials can be readily produced. In addition, the above-mentioned reduction in thickness of the film can provide a variety of combinations such as multilayered film in which thin films made of the identical material are stacked; multilayered film in which organic thermoelectric components and hybrid material films are alternately stacked; and multilayered film fabricated from films such as doped organic thermoelectric material film or hybrid film, or non-doped thermoelectric material film or hybrid film.

No particular limitation is imposed on the method of forming such thin film, and application methods such as casting, spin-coating, and dipping can be employed.

After completion of coating through such a method, the coat is dried to remove an organic solvent, to thereby obtain thin film. If required, subsequent heat treatment may be performed. The treatment temperature is, for example, 50° C. to 1,200° C., preferably 50° C. to 500° C.

Through the heat treatment, the remaining organic polymer is fired out or removed, and the crystal structure of the inorganic thermoelectric component may be changed. The change induces densification of the produced thermoelectric materials, thereby enhancing thermoelectric characteristics.

As described above, the thermoelectric materials of the present invention attain a thermoelectric figure of merit (ZT) of 0.02 or more, which conventional organic thermoelectric materials have not easily attained; has good processability; and provides thin film which inorganic thermoelectric materials cannot produce. Thus, the materials desirably find uses as a novel type of thermoelectric materials.

Through employment of the thermoelectric materials of the present invention, thermoelectric devices providing excellent thermoelectric characteristics can be easily produced. These devices can be employed for so-called thermoelectric conversion (i.e., direct energy conversion without use of any moving parts), including thermoelectric power generation on the basis of the Seebeck effect and electronic cooling on the basis of the Peltier effect.

EXAMPLES

The present invention will next be described in detail by way of examples.

Example 1

Polyaniline (PANi) (0.505 g) and camphorsulfonic acid (CSA) (0.586 g) were sufficiently mixed in an agate mortar, and the resultant mixture was transferred into a screw tube. To the mixture, m-cresol (24.835 g) was added, and the resultant mixture was subjected to ultrasonication (50° C., 4 h), followed by centrifugation, to thereby yield a conductive polyaniline solution. Bismuth telluride (ground in an agate mortar for five minutes) was added to the solution such that the mol ratio of PANi/Bi$_2$Te$_3$ was regulated to 1/1, followed by thorough mixing in an agate mortar. The resultant mixture was cast on a silicon wafer substrate. The cast film was dried in vacuum (60° C., overnight). Observation under an SEM revealed that the film has a dense structure in which bismuth telluride is uniformly dispersed.

Example 2

The procedure of Example 1 was repeated, except that the mol ratio of PANi/Bi$_2$Te$_3$ was regulated to 1/3.2, to thereby produce a hybrid film. Observation under an SEM revealed that the film has a dense structure in which bismuth telluride is uniformly dispersed.

Example 3

The film obtained in Example 2 was further heat-treated under the following conditions.

A sample was placed in a heater, and nitrogen was caused to flow in the heater for 10 minutes. The sample was heated under nitrogen (200 mL/min) in accordance with the following temperature profile: heated at 5° C./min from room temperature to 500° C.; maintained at 500° C. for 30 minutes; and allowed to cool to room temperature. Observation of the thus-treated film under an SEM revealed that the morphology of the film was unchanged.

Test Example 1

Each of the hybrid films obtained in Examples 2 and 3 was set in a thermoelectric voltmeter in order to analyze thermoelectric characteristics. The results indicate that all samples exhibit n-type thermoelectric characteristics. Although no substantial change was observed in conductivity of the sample of Example 3 (heat-treated film), the Seebeck coefficient was remarkably increased.

As shown in FIG. 1, the thermoelectric power factor TPF (S$^2$σ) of the heat-treated film was remarkably increased as compared with the case before heat treatment. The thermoelectric figure of merit (ZT) reached a maximum 0.2, even though the sample was not doped with bismuth telluride.

Example 4

Polyaniline (PANi) (0.030 g) and camphorsulfonic acid (CSA) (0.035 g) were sufficiently mixed in an agate mortar, and the resultant mixture was transferred into a screw tube. To the mixture, m-cresol (0.63 g) and EMITFSI (0.012 g) were added, and the resultant mixture was subjected to ultrasonication (50° C., 3 h), to thereby yield a polyaniline solution. $Co_{0.9}Pt_{0.1}Sb_3$ (0.263 g) was added to the solution (0.032 g) with mixing. The resultant mixture was applied to a ceramic plate, to thereby prepare a sample.

The proportions (mol) of PANi, EMITFSI, and $Co_{0.9}Pt_{0.1}Sb_3$ were PANi:EMITFSI:$Co_{0.9}Pt_{0.1}Sb_3$=1:0.09:41.6.

Example 5

$Co_{0.9}Pt_{0.1}Sb_3$ (0.144 g) was added to the conductive polyaniline solution which had been obtained in Example 4 (0.013 g) with mixing. The resultant mixture was applied to a ceramic plate, to thereby prepare a sample.

The proportions (mol) of PANi, EMITFSI, and $Co_{0.9}Pt_{0.1}Sb_3$ were PANi:EMITFSI:$Co_{0.9}Pt_{0.1}Sb_3$=1:0.09:62.5.

Comparative Example 1

Polyaniline (PANi) (0.025 g) and camphorsulfonic acid (CSA) (0.029 g) were sufficiently mixed in an agate mortar, and the resultant mixture was transferred into a screw tube. To the mixture, m-cresol (2.48 g) was added, and the resultant mixture was subjected to ultrasonication (50° C., 3 h), to thereby yield a polyaniline solution. The solvent of the solution was removed, to thereby yield a film serving as a test sample.

Comparative Example 2

Polyaniline (PANi) (0.051 g) and camphorsulfonic acid (CSA) (0.059 g) were sufficiently mixed in an agate mortar, and the resultant mixture was transferred into a screw tube. To the mixture, m-cresol (2.48 g) and EMITFSI (0.02 g) were added, and the resultant mixture was subjected to ultrasonication (50° C., 3 h), to thereby yield a polyaniline solution. The solvent of the solution was removed, to thereby yield a film serving as a test sample.

The proportion (mol) of PANi and EMITFSI was PANi:EMITFSI=1:0.09.

Comparative Example 3

$Co_{0.9}Pt_{0.1}Sb_3$ (0.098 g) was added to the polyaniline solution which had been obtained in Comparative Example 1 (0.103 g) with mixing. The resultant mixture was applied to a ceramic plate, to thereby prepare a test sample.

The proportion (mol) of PANi and $Co_{0.9}Pt_{0.1}Sb_3$ was PANi:$Co_{0.9}Pt_{0.1}Sb_3$=1:20.4.

Comparative Example 4

$Co_{0.9}Pt_{0.1}Sb_3$ (0.105 g) was added to the polyaniline solution which had been obtained in Comparative Example 1 (0.055 g) with mixing. The resultant mixture was applied to a ceramic plate, to thereby prepare a test sample.

The proportion (mol) of PANi and $Co_{0.9}Pt_{0.1}Sb_3$ was PANi:$Co_{0.9}Pt_{0.1}Sb_3$=1:41.0.

Comparative Example 5

Bulk $Co_{0.9}Pt_{0.1}Sb_3$ serving as inorganic thermoelectric materials was used as a test sample of Comparative Example 5.

Comparative Example 6

The bulk $Co_{0.9}Pt_{0.1}Sb_3$ of Comparative Example 5 serving as inorganic thermoelectric materials was pulverized and the pulverized matter was molded by use of a handy presser, to thereby obtain pellets thereof. The pellets were used as a test sample of Comparative Example 6.

Test Example 2

Each of the samples obtained in Examples 4 and 5 and Comparative Examples 1 to 6 was set in a thermoelectric voltmeter in order to measure the Seebeck coefficient. The results are shown in FIG. 2.

The samples obtained in Examples 4 and 5 and Comparative Examples 1 to 6 were evaluated in terms of processability. Rating "O" denotes a sample which could form thin film through application, and rating "X" denotes a sample which could not form thin film through application. The results are shown in Table 1.

Figure 2:
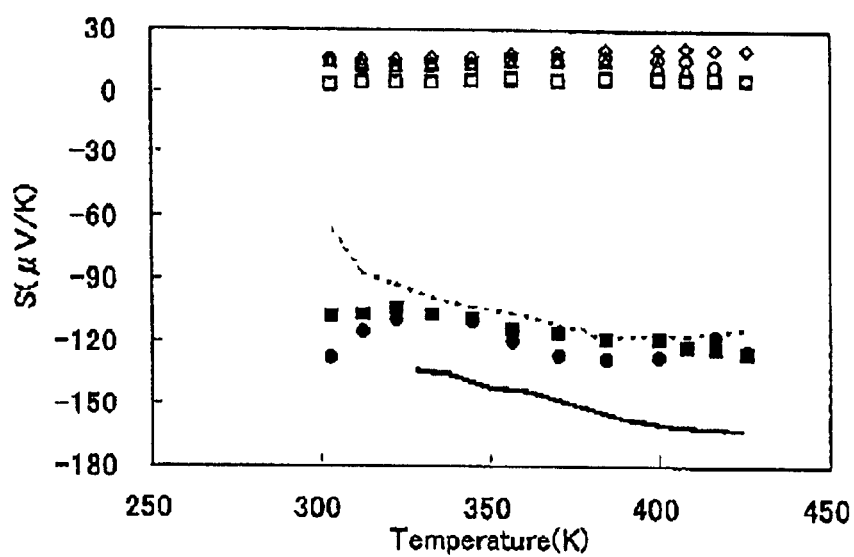
FIG. 2 is a graph showing the Seebeck coefficient of samples of Examples 4 and 5 and Comparative Examples 1 to 6.

As is clear from FIG. 2, all samples of Examples 4 and 5 (each sample containing an organic thermoelectric component, an inorganic thermoelectric component, and an ionic liquid) exhibit n-type thermoelectric characteristics and a Seebeck coefficient approximately equal to that of samples of Comparative Examples 5 and 6 (each sample containing solely inorganic thermoelectric component), when the results are compared with the sample of Comparative Example 1 (sample containing solely organic thermoelectric component), the sample of Comparative Example 2 (sample containing an organic thermoelectric component and an ionic liquid), and the samples of Comparative Examples 3 and 4 (each sample containing an organic thermoelectric component and an inorganic thermoelectric component).

The results also indicate that the samples in Examples 4 and 5 containing an organic thermoelectric component exhibit processability superior to the samples in Comparative Examples 5 and 6 containing solely an inorganic thermoelectric component.

Thus, incorporation of an inorganic thermoelectric component and an ionic liquid into an organic thermoelectric component results in production of the thermoelectric materials having a large Seebeck coefficient and excellent processability.

TABLE 1

|  | Ex. 4 | Ex. 5 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|
| Processability | O | O | O | O | O | O | X | X |

As described hereinabove, according to the present invention, hybridization of organic thermoelectric materials and inorganic thermoelectric materials attains production of novel thermoelectric materials having, in combination, processability attributed to the organic thermoelectric materials and excellent thermoelectric characteristics attributed to the inorganic thermoelectric materials, the thermoelectric materials being capable of providing n-type thermoelectric characteristics in accordance with the nature of the employed inorganic thermoelectric materials.

What is claimed is:

1. The thermoelectric materials comprising an organic thermoelectric component and an inorganic thermoelectric component, wherein the organic thermoelectric component and the inorganic thermoelectric component are united in a dispersed state, the organic thermoelectric component being at least one species selected from among polyaniline and derivatives thereof; polypyrrole and derivatives thereof; polythiophene and derivatives thereof; polyphenylenevinylene derivatives; poly(p-phenylene) derivatives; polyacene derivatives; and copolymers thereof, and the inorganic thermoelectric component being at least one species selected from among Bi—(Te, Se) series, Si—Ge series, Pb—Te series, GeTe—AgSbTe series, (Co, Ir, Ru)—Sb series, and (Ca, Sr, Bi)$Co_2O_5$ series.

2. The thermoelectric materials according to claim 1, wherein the inorganic thermoelectric component have a particle size of several hundreds $\mu$m or less, and the thermoelectric materials are formed by dissolving the organic thermoelectric component in an organic solvent to thereby yield a solution; dispersing the inorganic thermoelectric component in the solution to thereby yield a dispersion liquid; and removing the organic solvent from the dispersion liquid.

3. The thermoelectric materials according to claim 1, which are in the form of thin film.

4. The thermoelectric materials according to claim 1, which form at least one layer in multilayer film comprising a plurality of stacked thin films.

5. The thermoelectric materials according to claim 1, wherein the inorganic thermoelectric component in the form of microparticles is surrounded by the organic thermoelectric component in the dispersed state.

6. The thermoelectric materials according to claim 1, which have a ratio by mol of the organic thermoelectric component to the inorganic thermoelectric component of at least 1/99.

7. The thermoelectric materials according to claim 6, which have a ratio by mol of the organic thermoelectric component to the inorganic thermoelectric component of 1/99 to 91/9.

8. The thermoelectric materials according to claim 1, wherein the organic and inorganic thermoelectric components are united through heat treatment.

9. The thermoelectric materials according to claim 8, wherein the heat treatment is performed at 50° C. to 500° C.

10. The thermoelectric materials according to claim 1, the thermoelectric materials have a thermoelectric figure of merit (ZT) of at least 0.02.

11. The thermoelectric materials according to claim 1, which further contain a plasticizer, wherein the inorganic thermoelectric component is united such that microparticles thereof cohere together.

12. The thermoelectric materials according to claim 11, which contain the inorganic thermoelectric component in an amount of 10–70 mol based on 1 mol of the organic thermoelectric component.

13. The thermoelectric materials according to claim 11, wherein the plasticizer is an ionic liquid.

14. The thermoelectric materials according to claim 11, which contain the plasticizer in an amount of 0.01–0.2 mol based on 1 mol of the organic thermoelectric component.

15. The thermoelectric materials according to claim 11, wherein the inorganic thermoelectric component has a particle size of 50 $\mu$m or less.

16. The thermoelectric materials according to claim 11, wherein the inorganic thermoelectric component is treated with a titanate series or silane series surface treating agent.

17. A thermoelectric device employing thermoelectric materials as recited in any one of claims 1 to 16.

18. A method for producing thermoelectric materials comprising:

dispersing an inorganic thermoelectric component in an organic thermoelectric component solution in which at least a portion of an organic thermoelectric component is dissolved, to thereby yield a dispersion; and applying the dispersion to an object, to thereby form thereon thin film having one or more layers;

the organic thermoelectric component being at least one species selected from among polyaniline and derivatives thereof; polypyrrole and derivatives thereof; polythiophene and derivatives thereof; polyphenylenevinylene derivatives; poly(p-phenylene) derivatives; polyacene derivatives; and copolymers thereof, and the inorganic thermoelectric component being at least one species selected from among Bi—(Te, Se) series, Si—Ge series, Pb—Te series, GeTe—AgSbTe series, (Co, Ir, Ru)—Sb series, and (Ca, Sr, Bi)$Co_2O_5$ series.

19. A method for producing thermoelectric materials according to claim 18, wherein the inorganic thermoelectric component has a particle size of 50 $\mu$m or less.

20. A method for producing thermoelectric materials according to claim 18, wherein the thermoelectric materials contains the inorganic thermoelectric component in an amount of 10–70 mol based on 1 mol of the organic thermoelectric component.

21. A method for producing thermoelectric materials according to claim 18, wherein the thermoelectric materials further contain a plasticizer.

22. A method for producing thermoelectric materials according to claim 21, wherein the plasticizer is an ionic liquid.

23. A method for producing thermoelectric materials according to claim 21, wherein the thermoelectric materials contain the plasticizer in an amount of 0.01–0.2 mol based on 1 mol of the organic thermoelectric component.

24. A method for producing thermoelectric materials according to any one of claims 18 to 23, wherein the dispersion is applied through a method selected from among casting, spin-coating, and dipping.

* * * * *